United States Patent
Lu et al.

(10) Patent No.: US 9,602,062 B2
(45) Date of Patent: Mar. 21, 2017

(54) AUDIO SWITCHING AMPLIFIER

(71) Applicant: QUALCOMM Incorporated, San Diego, CA (US)

(72) Inventors: Jingxue Lu, San Diego, CA (US); Ankit Srivastava, San Diego, CA (US); Matthew David Sienko, San Diego, CA (US); Manu Mishra, San Diego, CA (US); Sheng Zhang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/320,118

(22) Filed: Jun. 30, 2014

(65) Prior Publication Data

US 2015/0381119 A1    Dec. 31, 2015

(51) Int. Cl.
*H03F 3/217* (2006.01)
*H03F 1/32* (2006.01)
(Continued)

(52) U.S. Cl.
CPC ............. *H03F 1/32* (2013.01); *H03F 1/3205* (2013.01); *H03F 3/185* (2013.01);
(Continued)

(58) Field of Classification Search
CPC . H03F 1/32; H03F 3/185; H03F 3/217; H03F 3/2173; H03F 3/2171; H03F 2200/351; H03F 2200/03; H03F 2200/331; H03F 2201/3212; H03F 2201/3215; H03F 3/45475; H03F 1/3205
(Continued)

(56) References Cited

U.S. PATENT DOCUMENTS 6,614,297 B2 *  9/2003  Score .................. H03F 3/217
                                                    330/10
7,332,962 B2 *  2/2008  Wu .................... H03F 3/2173
                                                    330/10
(Continued)

FOREIGN PATENT DOCUMENTS

CN    101847968 A    9/2010
EP    0817371 A1     1/1998
(Continued)

OTHER PUBLICATIONS

Cartasegna D., et al., "A 0.18-[mu]m CMOS, -92-dB THD, 105-dBA DR, Third-Order Audio Class-D amplif", 2013 Proceedings of the ESSCIRC (ESSCIRC), IEEE, Sep. 16, 2013, XP032518960, pp. 169-172, ISSN: 1930-8833, DOI: 10.1109/ESSCIRC.2013. 6649099 ISBN: 978-1-4799-0643-7 [retrieved on Oct. 28, 2013].
(Continued)

*Primary Examiner* — Khanh V Nguyen
(74) *Attorney, Agent, or Firm* — Haynes and Boone, LLP

(57) ABSTRACT

A switching amplifier includes a compensation circuit to compensate for DC offset in the amplifier, to enhance operation of the switching amplifier. The compensation circuit may comprise a SAR ADC, where the DAC element can be used to provide a compensation voltage. The switching amplifier may further include a PWM modulator configured to avoid cross-talk to further enhance operation of the switching amplifier.

21 Claims, 9 Drawing Sheets

(51) Int. Cl.
 *H03F 3/185* (2006.01)
 *H03F 3/45* (2006.01)
(52) U.S. Cl.
 CPC ......... *H03F 3/2171* (2013.01); *H03F 3/2173* (2013.01); *H03F 3/45475* (2013.01); *H03F 3/217* (2013.01); *H03F 2200/03* (2013.01); *H03F 2200/351* (2013.01); *H03F 2203/45512* (2013.01); *H03F 2203/45528* (2013.01)
(58) Field of Classification Search
 USPC ................. 330/10, 251, 207 A; 332/109
 See application file for complete search history.

(56) References Cited

U.S. PATENT DOCUMENTS

| | | | |
|---|---|---|---|
| 7,733,170 | B2 | 6/2010 | Cheng |
| 8,115,541 | B2 | 2/2012 | Kim |
| 8,138,832 | B2 | 3/2012 | Yu et al. |
| 2007/0279126 | A1 | 12/2007 | Krishnan et al. |
| 2008/0130186 | A1 | 6/2008 | Nagase et al. |
| 2008/0284508 | A1 | 11/2008 | Walker et al. |
| 2011/0006843 | A1* | 1/2011 | Tanaka .................. H03F 3/217 330/251 |
| 2011/0140773 | A1 | 6/2011 | Lee et al. |
| 2011/0267014 | A1 | 11/2011 | Nakai |
| 2012/0274399 | A1 | 11/2012 | Seedher et al. |
| 2013/0033319 | A1 | 2/2013 | Chen et al. |
| 2013/0328628 | A1* | 12/2013 | Chen .................... H03F 3/2178 330/251 |

FOREIGN PATENT DOCUMENTS

| | | |
|---|---|---|
| EP | 1091489 A2 | 4/2001 |
| WO | 0110012 A1 | 2/2001 |
| WO | 02087073 A2 | 10/2002 |
| WO | 2011064787 A1 | 6/2011 |

OTHER PUBLICATIONS

International Search Report and Written Opinion—PCT/US2015/034295—ISA/EPO—Jan. 7, 2016.

* cited by examiner

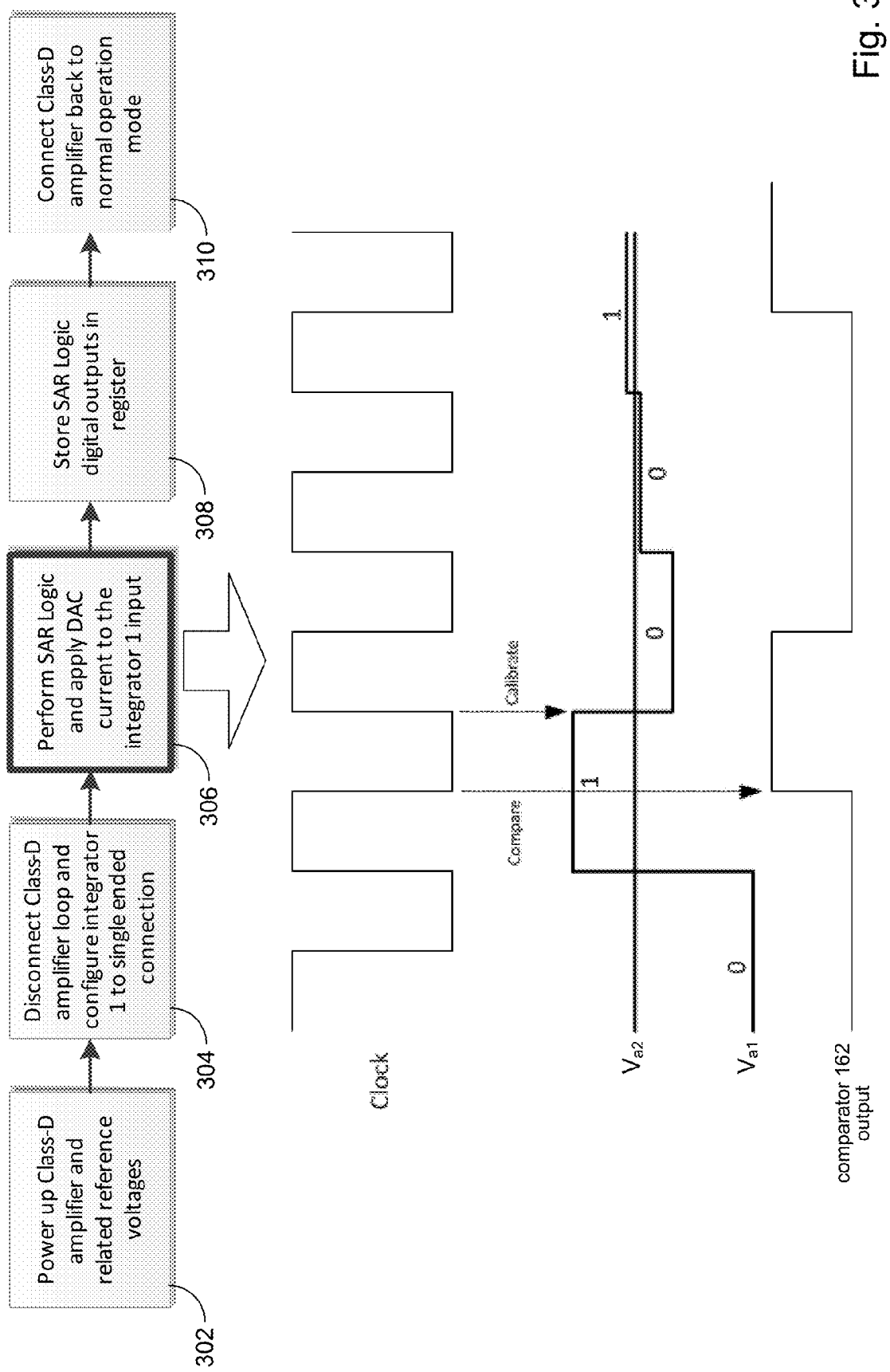

AUDIO SWITCHING AMPLIFIER

BACKGROUND

Unless otherwise indicated, the foregoing is not admitted to be prior art to the claims recited herein and should not be construed as such.

Switching amplifiers, such as Class-D audio amplifiers, offer high efficiency operation due to the use of switching output stages. Accordingly class-D amplifiers are commonly used for audio presentation in portable device applications such as MP3 players, smartphones, computer tablets, and other battery operated devices, where power efficiency is an important consideration. DC offsets inherent in the amplifier circuits comprising class-D amplifier designs, however, impact their effectiveness in portable devices. DC offsets manifest themselves audibly as clicks and pops in the audio output, which can negatively impact the user experience; and DC offsets tend to increase quiescent power consumption, which can negatively impact power performance.

Typical class-D amplifier designs use a 3-state pulse width modulation (PWM) modulator. The 3-state PWM modulator allows for filter-less designs, thus avoiding the cost of reconstruction filters in terms of silicon area on the chip. 3-state PWM modulators, however, can suffer from cross-talk between the plus and minus PWM channels. The cross-talk can arise from coupling with comparators in the PWM modulator design or between the comparators and the output stages of the PWM modulator. Cross-talk can degrade the total harmonic distortion (THD) characteristics of the class-D amplifier caused by PWM misfiring due to the cross-talk.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings:

FIG. 3 illustrates the processing between the first and second configurations of the switching amplifier in accordance with the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
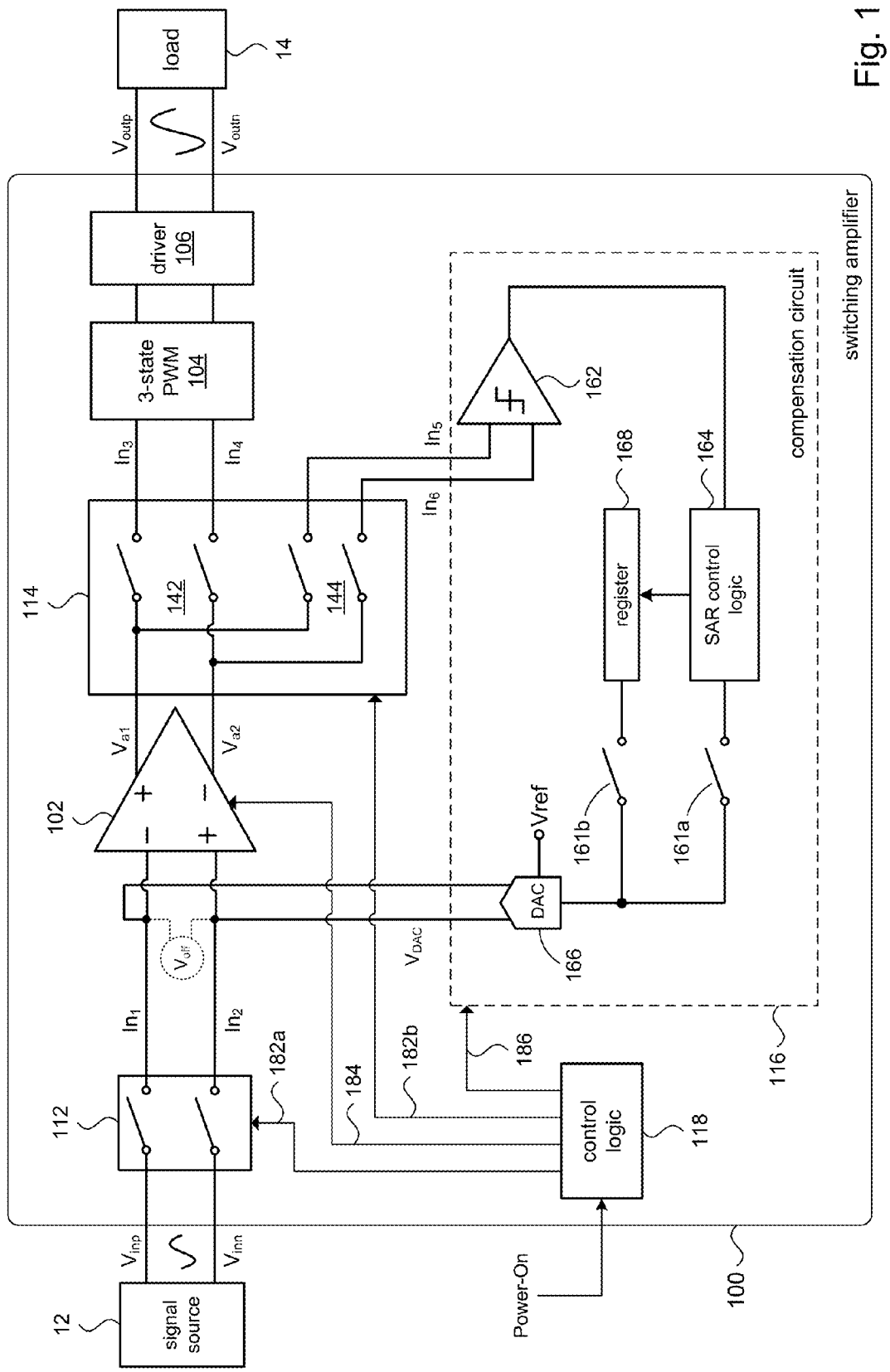
FIG. 1 illustrates an embodiment of a switching amplifier in accordance with the present disclosure.

FIG. 1 shows an illustrative embodiment of a switching amplifier 100 in accordance with the present disclosure. The switching amplifier 100 may be connected to an external signal source 12. In some embodiments, for example, the signal source 12 may be audio processing circuitry that outputs audio input signals on the $V_{inp}$ and $V_{inn}$ signal lines. The switching amplifier 100 amplifies the $V_{inp}$ and $V_{inn}$ input signals to produce output signal ($V_{outp}$ and $V_{outn}$) on the $V_{outp}$ and $V_{outn}$ signal lines The output on the $V_{outp}$ and $V_{outn}$ signal lines may be connected to a load 14, which for example may be a speaker or a headphone.

The switching amplifier 100 may include connector 112 that can selectively connect the signal lines $V_{inp}$ and $V_{inn}$ to the inputs $In_1$ and $In_2$ of an input integrator circuit 102. In some embodiments, the connector 112 may comprise a pair of connector switches to selectively connect and disconnect the signal lines $V_{inp}$ and $V_{inn}$ to and from the inputs $In_1$ and $In_2$. The connector switches may be physical switches or semiconductor switches such as FET devices and the like. Operation of the connector 112 in accordance with the present disclosure will be discussed below.

In accordance with the present disclosure, the integrator circuit 102 can be selectively configured as a differential integrator having differential outputs $V_{a1}$ and $V_{a2}$, or as a single-ended integrator. Operation of the integrator circuit 102 in accordance with the present disclosure will be discussed below.

The switching amplifier 100 may include connector 114 to connect the $V_{a1}$ and $V_{a2}$ outputs of the integrator circuit 102 to either a PWM modulator 104 or a compensation circuit 116. In accordance with the present disclosure, the connector 114 may selectively connect the $V_{a1}$ and $V_{a2}$ outputs to either the PWM modulator 104 or to the compensation circuit 116, but not to both the PWM modulator 104 and the compensation circuit 116. In some embodiments, the connector 114 may include a pair of connector switches 142 that can be operated to connect the $V_{a1}$ and $V_{a2}$ outputs to the Ins and IN inputs of the PWM modulator 104. The connector 114 may further include a pair of connector switches 144 that can be operated to connect the $V_{a1}$ and $V_{a2}$ outputs to the Ins and Ins inputs of the compensation circuit 116. The connector switches 142, 144 may be physical switches or semiconductor switches such as FET devices and the like.

The switching amplifier 100 may include a driver circuit 106 that is connected to the outputs of the PWM modulator. The driver circuit 106 may include outputs for a connection to the load 14; e.g., via the $V_{outp}$ and $V_{outn}$ signal lines.

In some embodiments, the compensation circuit 116 may include a comparator 162 connected to the Ins and Ins inputs. The output of the comparator 116 may be connected control logic 164. A digital to analog converter (DAC) 166 may be connected to the inputs $In_1$ and $In_2$ of the integrator circuit 102. A switch 161a can connect the control logic 164 to an input of the DAC 166. An offset register 168 may store an output of the control logic 164. A switch 161b can provide the content of register 168 to the DAC 166. The switches 161a, 161b may be physical switches or semiconductor switches such as FET devices and the like.

In some embodiments, the control logic 164 may include logic for an analog to digital converter (ADC) known as a successive approximation register (SAR) ADC. As will be explained in more detail below, the compensation circuit 116 can operate with the integrator circuit 102, in accordance with the present disclosure, as a SAR ADC.

As explained above, most practical amplifiers have a DC offset that is inherent to their design. The DC offset in the switching amplifier 100 is largely characterized by the DC offset of input integrator circuit 102. This DC offset may be represented as shown in FIG. 1 by a voltage source $V_{off}$, illustrated in dashed lines, superimposed on the inputs $In_1$ and $In_2$ of the integrator circuit 102.

The switching amplifier 100 may include control logic 118. The control logic 118 may assert or otherwise generate various control signals 182a, 182b, 184, 186 to control various components in the switching amplifier 100. The control signals may be analog signals or digital signals. In some embodiments, for example, the control signals 182-186 may be provided via signal lines. Control signals 182a, 182b may control operation of connectors 112, 114, respectively. In accordance with the present disclosure, control signal 184 may control the configuration of integrator circuit 102. As mentioned above and discussed below, the integrator circuit 102 may be configured as a differential integrator or as a singled-ended integrator. Further in accordance with the present disclosure, control signal 186 may control operation of the compensation circuit 116.

In some embodiments, a Power-On signal may initiate or otherwise activate the control logic 118 to configure the switching amplifier 100 in a first configuration, although the triggering event may be other than when power is applied. In accordance with the present disclosure, operation of the switching amplifier 100 in the first configure serves to sense the DC offset voltage in the integrator circuit 102 and determine a compensation voltage. Further in accordance with the present disclosure, the control logic 118 may configure the switching amplifier 100 in a second configuration to operate as a class-D amplifier, using the compensating voltage sensed in the first configuration to compensate for the DC offset in the integrator circuit 102.

In some embodiments, the control logic 118 may configure the switching amplifier 100 to the second configuration upon completion of the DC offset sensing conducted during the first configuration. In other embodiments, the transition from the first configuration to the second configuration may be triggered by an event other than completion of the DC offset sensing.

Figure 1A:
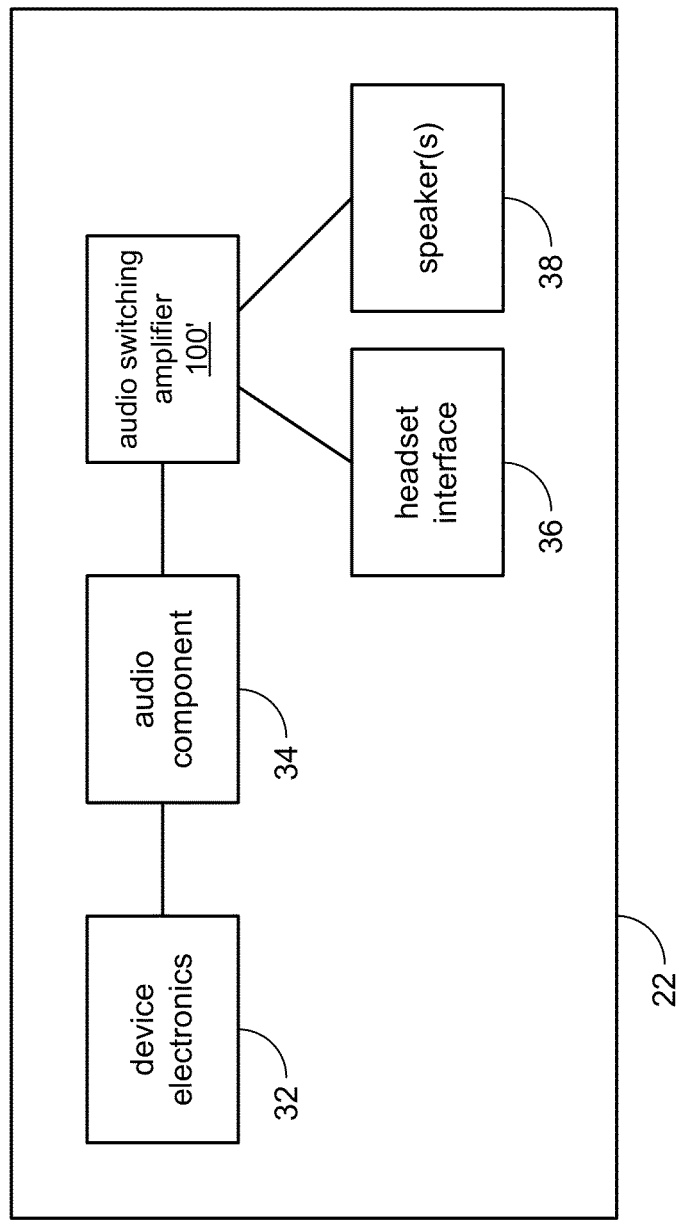
FIG. 1A illustrate a switching amplifier in accordance with the present disclosure as might be incorporated in an electronic device.

Referring to FIG. 1A, the switching amplifier 100 may be incorporated in an electronic device 22 as an audio switching amplifier 100'. For example, the electronic device 22 may be an MP3 player or some other audio playback device such as a digital recorder and the like. The electronic device 22 may be a smartphone, a portable computing device such as a computer tablet, and so on. The electronic device 22 may include device electronics such as a CPU, a display component, a display driver, memory, and so on. The device electronics may operate with an audio component to produce a low power audio signal that feeds into the audio amplifier 100' as an input audio signal. The audio amplifier 100' then amplifies the input audio signal to produce an output signal that can drive an output device such as a headset 36, speakers 38, or any other suitable load.

Figure 1B:
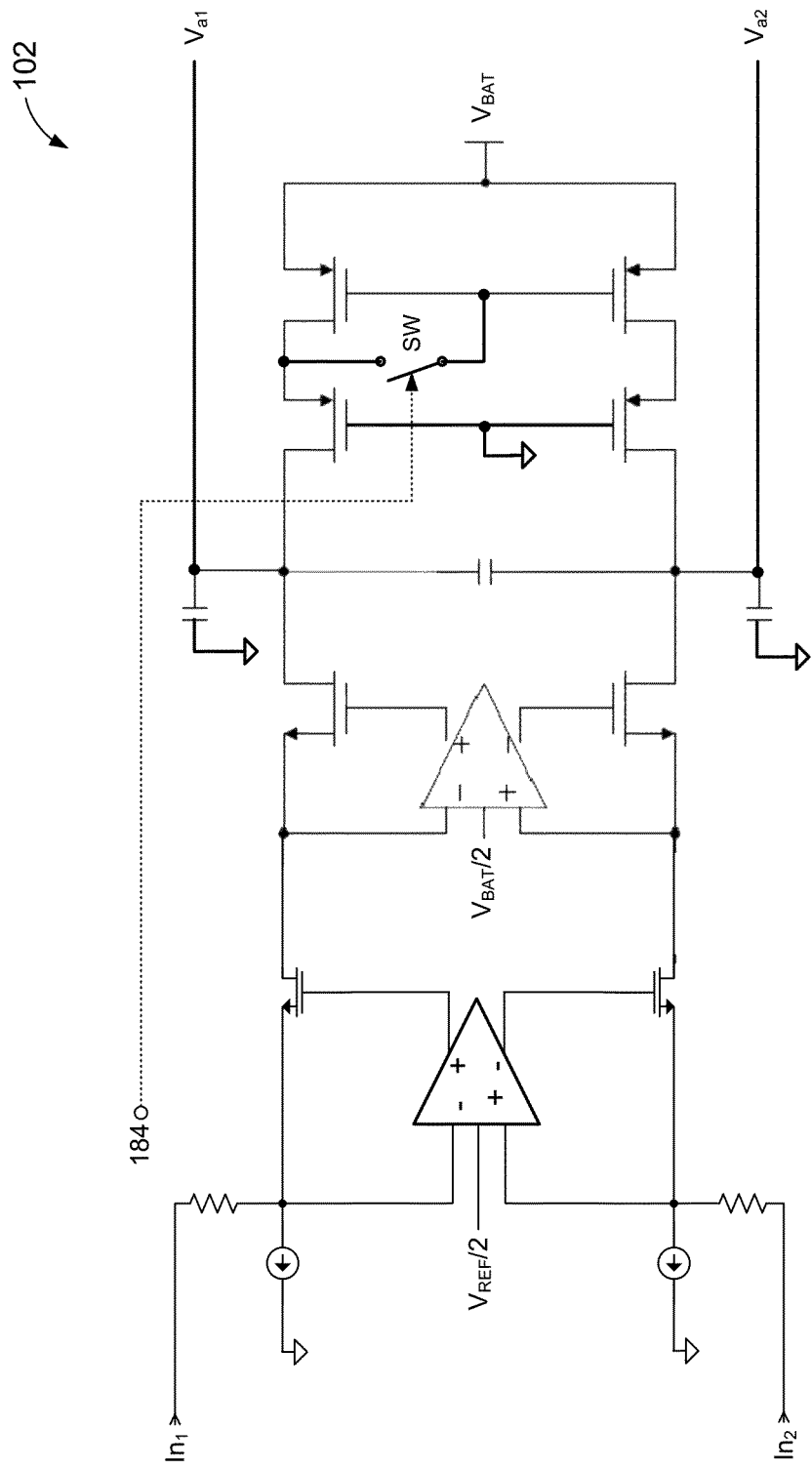
FIG. 1B illustrates an integrator circuit in a switching amplifier in accordance with the present disclosure.

FIG. 1B shows an illustrative embodiment of integrator circuit 102 in accordance with the present disclosure. The circuit shown in FIG. 1B is referenced to $V_{REF}$, which may be a suitable reference voltage in mobile devices. It will be appreciated, however, that the reference voltage may depend on the particular device that the switching amplifier 100 is used in. The control signal 184 from control logic 118 (FIG. 1) may operate a switch SW. When the switch SW is operated in the OPEN position (as shown in the figure), the integrator circuit 102 operates as a differential integrator. This mode of operation may be referred to as "differential mode." When the switch SW is operated in the CLOSE position, the integrator circuit 102 operates as a single-ended integrator, which can be referred to as "single-ended mode." It will be appreciated by those of ordinary skill that integrator circuit 102 may be implemented using other designs.

Figure 2A:
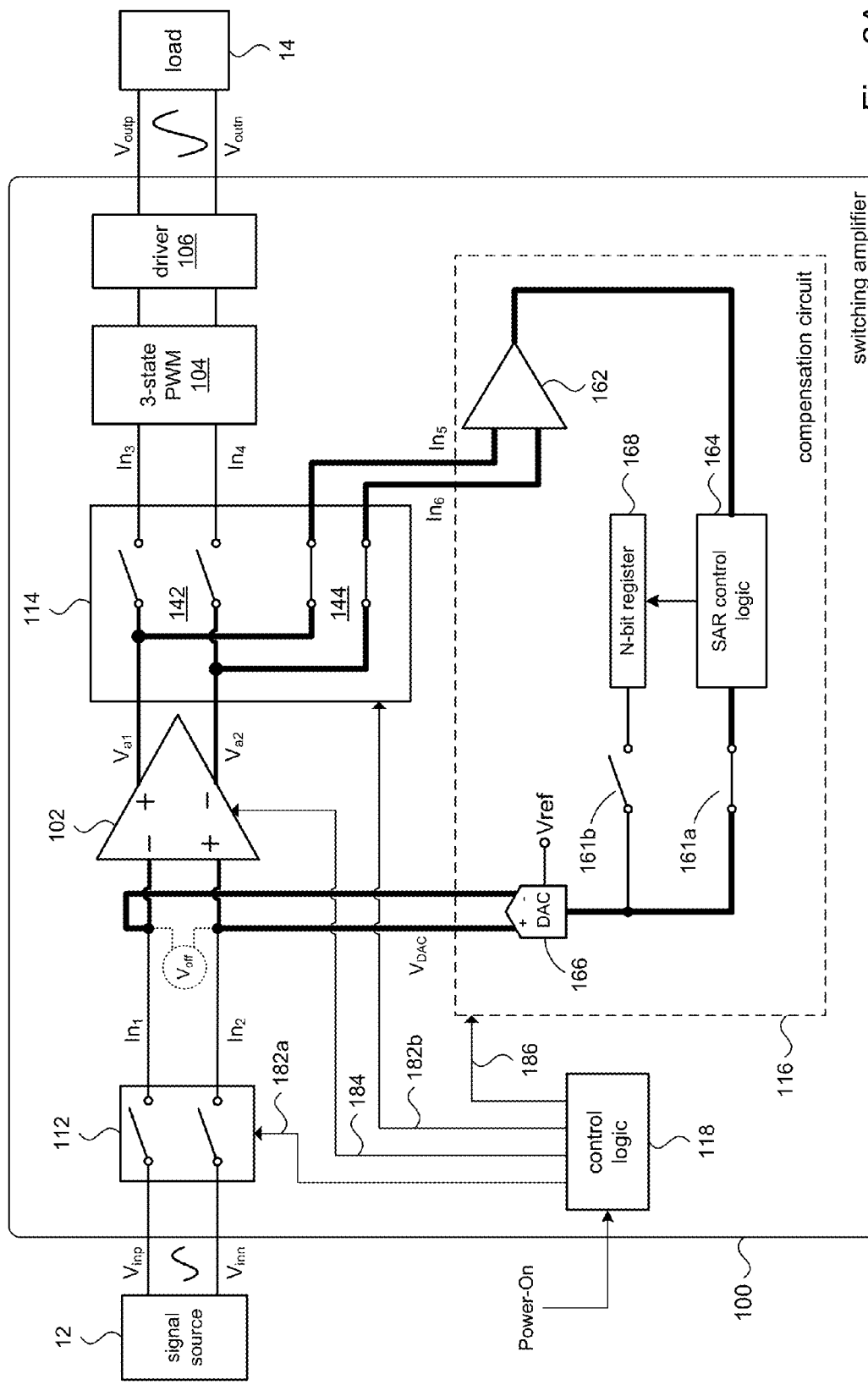
FIG. 2A illustrates operation of a switching amplifier in accordance with the present disclosure in a first configuration.
Figure 2B:
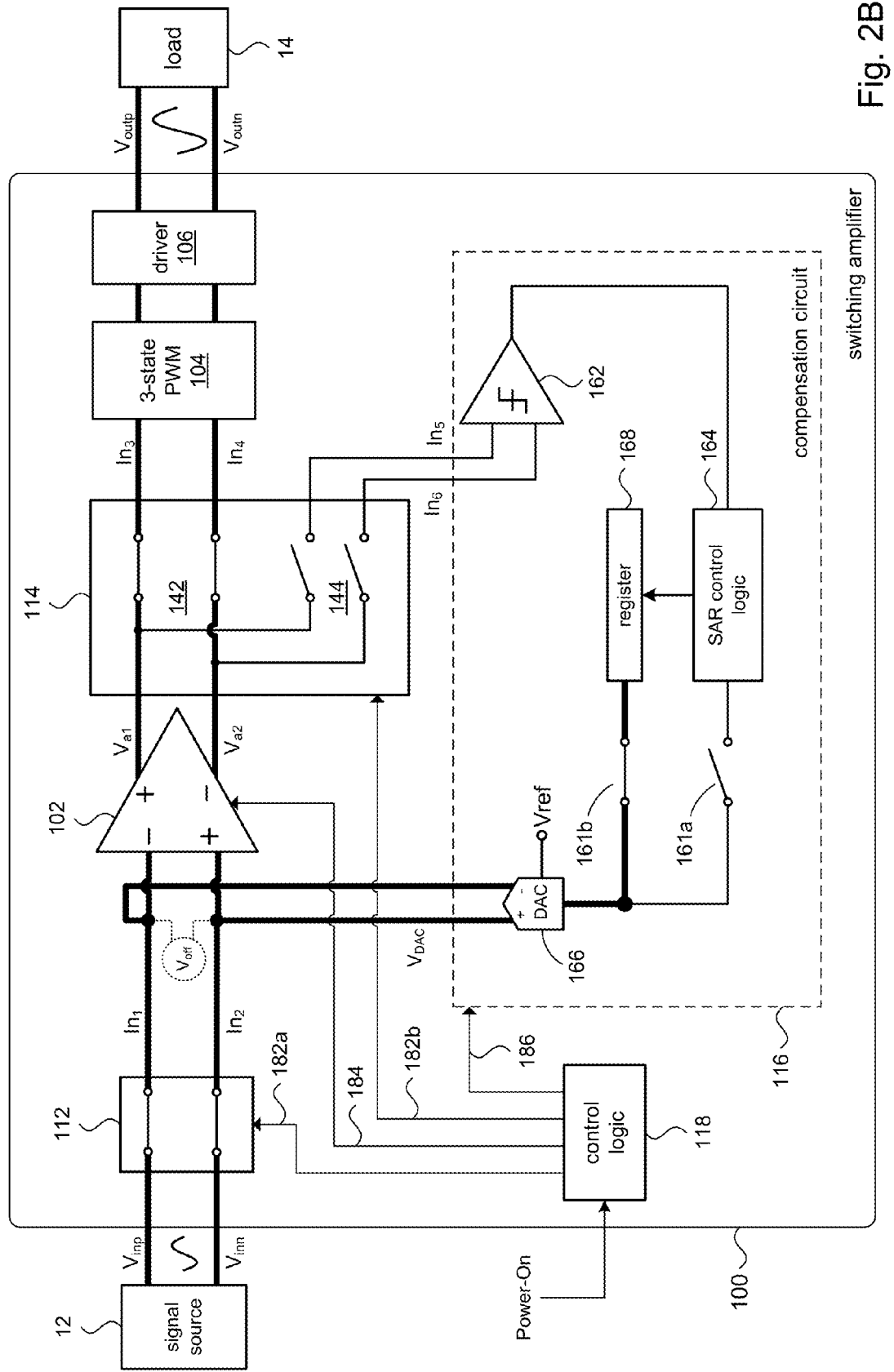
FIG. 2B illustrates operation of a switching amplifier in accordance with the present disclosure in a second configuration.

Referring now to FIGS. 2A and 2B, operation of the switching amplifier 100 in accordance with the present disclosure will now be explained. FIG. 2A shows the switching amplifier 100 configured in a first configuration, for example, by the control logic 118. As mentioned above, a triggering event that activates the control logic 118 may be a power on event, where power is applied to a device that incorporates the switching amplifier 100.

In some embodiments, the control logic 118 may assert control signal 182a to cause the connector switches of connector 112 to OPEN, so that that the signal lines $V_{inp}$ and $V_{inn}$ are disconnected, respectively, from the input lines $In_1$ and $In_2$. It will be understood, moreover, that the input lines $In_1$ and $In_2$ are connected to ground when the switching amplifier 100 is configured in the first configuration. The control logic 118 may assert control signal 182b to OPEN the pair of connector switches 142 to disconnect the outputs $V_{a1}$ and $V_{a2}$ from the PWM modulator 104 and to CLOSE the pair of connector switches 144 to connect the outputs $V_{a1}$ and $V_{a2}$ to the compensation circuit 116. The control logic 118 may assert control signal 184 to configure the integrator circuit 102 to operate as a single-ended integrator.

The control logic 118 may assert control signal 186 to operate the compensation circuit 116 to function as an ADC. In accordance with the present disclosure, the comparator 162, the control logic 164, and the DAC 166 operate in conjunction with the single-ended mode integrator circuit 102 as an N-bit SAR ADC.

The outputs $V_{a1}$ and $V_{a2}$ of integrator circuit 102 serve as the analog signal to be converted. With the inputs $In_1$ and $In_2$ of the integrator circuit 102 disconnected from the signal source 12, the voltage that appears at the inputs is the DC offset $V_{off}$ combined with the output $V_{DAC}$ of DAC 166. The voltage across the outputs $V_{a1}$ and $V_{a2}$ of integrator circuit 102 is therefore the DC offset voltage $V_{off}$ plus $V_{DAC}$. A comparison of outputs $V_{a1}$ and $V_{a2}$ is performed by the comparator 162. The output of comparator 162 drives the control logic 164 to successively produce the bits that represent the DC offset as an N-bit digital value. Though not shown, the control logic 164 may include a SAR working register to build up the N bits of the N-bit value, one bit at a time. With each succession, a new bit value is added to the content of the SAR working register. This, in turn, drives DAC 166 to generate a new value of $V_{DAC}$ in order to determine the next bit, successively reducing the voltage difference between outputs $V_{a1}$ and $V_{a2}$.

At the end of the conversion, the SAR working register in the control logic 164 contains a binary value that approximates the magnitude to the DC offset voltage to a precision determined by the number of bits, N, used to represent the binary value. The control logic 164 may store the N-bit value in offset register 168.

Referring now to FIG. 2B, the switching circuit 100 may be configured in a second configuration by the control logic 118. In some embodiments, the control logic 118 may configure the switching amplifier 100 in the second configuration implicitly, upon completion of the ADC conversion. In other embodiments, a separate event may be serve as an explicit trigger.

In some embodiments, the control logic 118 may assert control signal 182a to cause the connector switches of connector 112 to CLOSE, so that that the signal lines $V_{inp}$ and $V_{inn}$ are connected to the respective input lines $In_1$ and $In_2$. The control logic 118 may assert control signal 182b to CLOSE the pair of connector switches 142 and to OPEN the pair of connector switches 144 to connect the outputs $V_{a1}$ and $V_{a2}$ to the PWM modulator 104 and to disconnect the outputs from the compensation circuit 116. The control logic 118 may assert control signal 184 to configure the integrator circuit 102 to operate as a differential integrator.

In this second configuration, the switching amplifier 100 operates as an amplifier. The inputs $In_1$ and $In_2$ are connected to the signal source 12. The PWM modulator 104 and driver circuit 106 are engaged to produce output signal $V_{outp}$ and $V_{outn}$ to drive the load 14.

The control logic 118 may assert control signal 186 to operate the compensation circuit 116 to provide a compensating offset voltage. In particular, the N-bit value obtained during the ADC conversion in the first configuration, and stored in the register 168, can be provided to the DAC 166. The voltage $V_{DAC}$ produced by the DAC 166 can be used to cancel out, in large part, the DC offset $V_{off}$ of the integrator circuit 102. The compensation circuit 116, in accordance with the present disclosure, can realize significant savings in silicon area by using the DAC 166 in a dual role: (1) ADC conversion to determine the DC offset; and (2) generator to generate the compensation voltage.

Figure 2C:
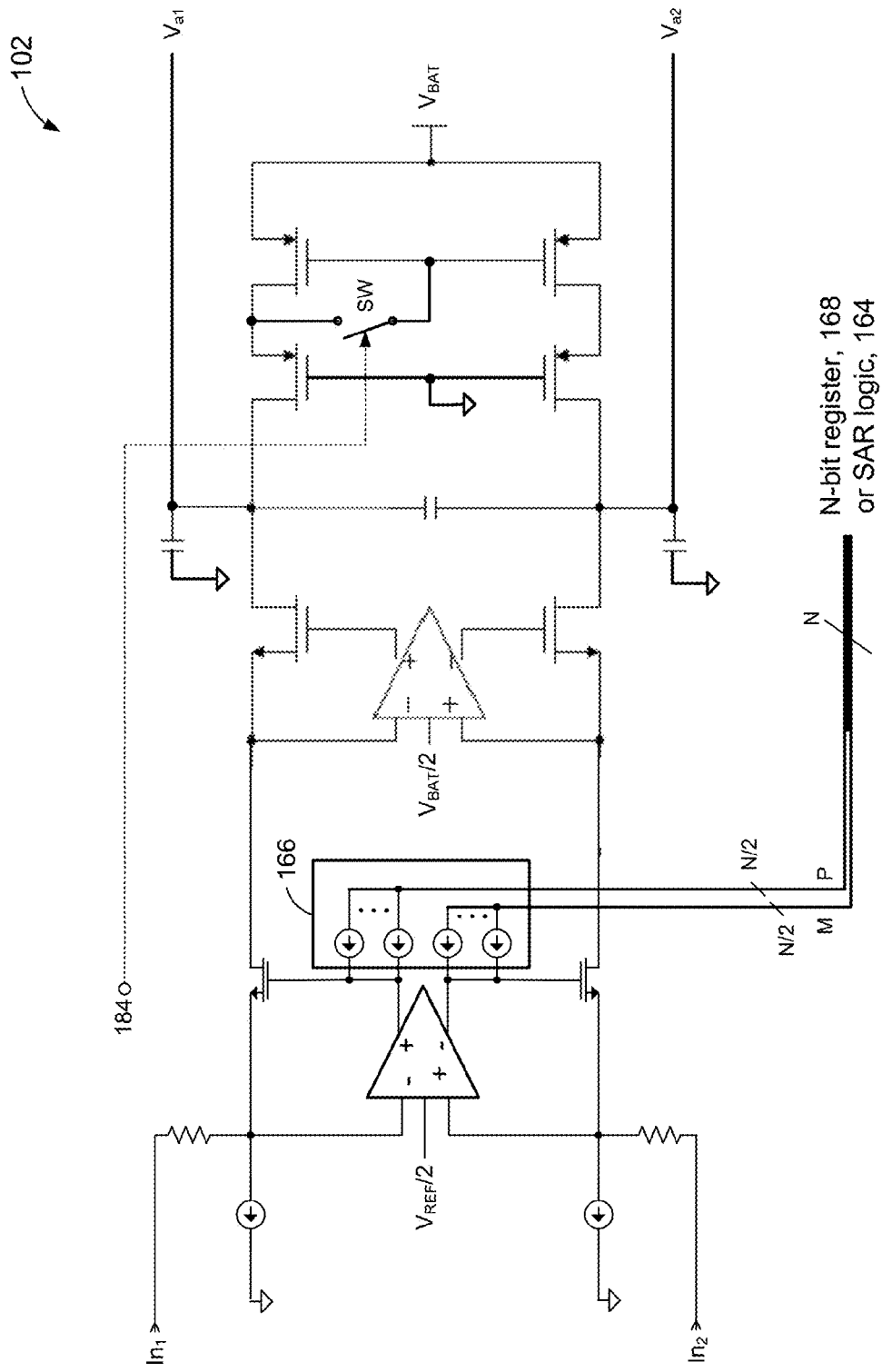
FIG. 2C illustrates an example of a DAC in accordance with an embodiment of the present disclosure.

FIG. 2C illustrates an example of a particular implementation of DAC 166 in accordance with an illustrative embodiment of the present disclosure. The DAC 166 may comprise a set of current sources. The N-bit output (from control logic 164 or register 168) may be divided into two N/2-bit control lines, M and P. Each control line M, P may control N/2 respective current sources to generate a differential output voltage according to the N-bit output Referring to FIG. 3, a high level description of a process flow in accordance with an embodiment of the present disclosure is shown. At 302, the switching amplifier 100 may be powered up, including bringing up various related reference voltages. After a settling time has passed, a Power-On signal may be asserted to trigger the control logic 118. At 304, the control logic 118 may assert its control signal 182-186 as described above to configure the switching amplifier 100 in the first configuration, including disconnecting the amplifier loop and configuring the integrator circuit 102 to single ended mode.

At 306, the SAR control logic 164 may operate the compensation circuit 116 and integrator circuit 102 as a SAR ADC. For example, the DAC 168 may apply current (via $V_{DAC}$) to the $In_1$ and $In_2$ inputs of the integrator circuit 102. In a particular embodiment, as illustrated in FIG. 3, at the falling edges of a clock, the comparator 162 may compare the $V_{a1}$ and $V_{a2}$ outputs of the integrator circuit 102. At the clock rising edges, the DAC 168 may apply current according to the comparator result to the input of integrator circuit 102, thus changing $V_{a1}$.

At the end of the conversion, the SAR control logic 168 may store the conversion result in register 166 (at 308). At 310, the control logic 118 may re-connect the switching amplifier in the second configuration for normal amplifier operation. In addition, the DAC 168 is operated to provide current to the input of integrator circuit 102 according to the value stored in register 166.

Figure 4:
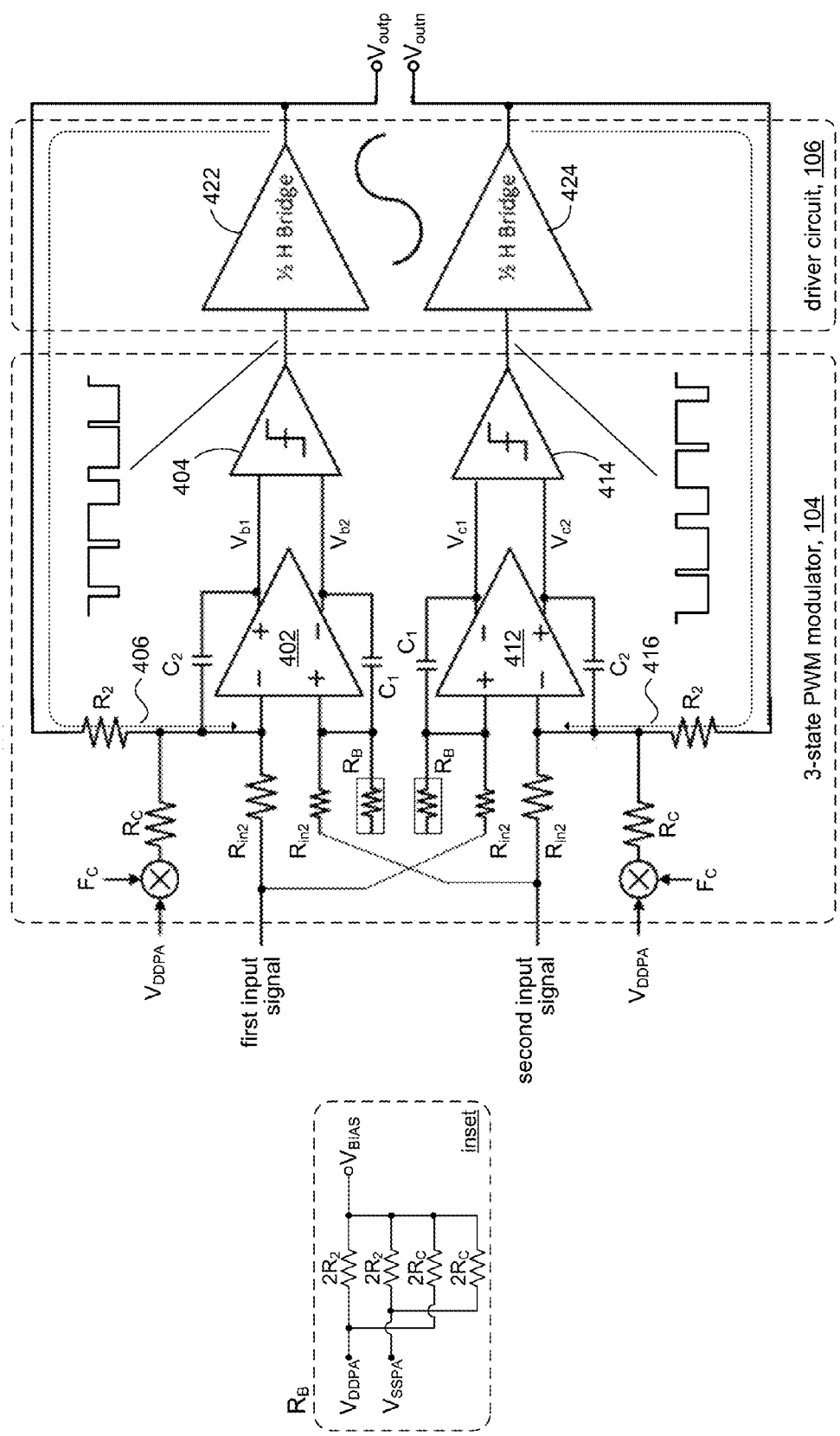
FIG. 4 illustrates details of a PWM modulator in a switching amplifier in accordance with the present disclosure.

Referring now to FIG. 4, an embodiment of the 3-state PWM modulator 104 in accordance with the present disclosure will be described. In some embodiments, the PWM modulator 104 may comprise a first differential integrator 402 comprising an op-amp and capacitors $C_1$ and $C_2$ configured as a differential integrator. Capacitors $C_1$ and $C_2$ provide feedback to respective non-inverting and inverting inputs of the op-amp. A second differential integrator 412 is similarly configured. Each differential integrator 402, 412 may include biasing at the respective non-inverting inputs via a bias resistor RB. An inset in FIG. 4 illustrates that the bias resistor RB may provide a suitable bias voltage $V_{BIAS}$ using a resistor network to divide down rail voltages $V_{DDPA}$ and $V_{SSPA}$.

In some embodiments, inputs to the differential integrators 402, 412 may be provided via input resistors $R_{in2}$. A first input signal (e.g., $V_{a1}$ from input integrator 102) may feed into the inverting input of differential integrator 402 and into the non-inverting input of differential integrator 412. Similarly, a second input signal (e.g., $V_{a2}$ from input integrator 102) may feed into the inverting input of differential integrator 412 and into the non-inverting input of differential integrator 402.

Each differential integrator 402, 412 may receive a clock signal $F_C$ that is biased by a power rail voltage (e.g., $V_{DDPA}$) via resistor $R_C$ at its respective inverting input. Integrator 402 may generate a differential output $V_{b1}$, $V_{b2}$ based on its inputs and clock signal $F_C$. Likewise, integrator 412 may generate a differential output $V_{c1}$, $V_{c2}$ based on its inputs and clock signal $F_C$.

The outputs $V_{b1}$ and $V_{b2}$ of the first differential integrator 402 may be connected to a first comparator 404. Likewise, the outputs $V_{c1}$ and $V_{c2}$ of the second differential integrator 404 may be connected to a second comparator 414.

In some embodiments, the driver circuit 106 may comprise a first ½ H-bridge circuit 422 and a second ½H-bridge circuit 424. The output of the first comparator 404 may connect to the first ½ H-bridge circuit 422, and the output of the second comparator 414 may connect to the second ½ H-bridge circuit 424. The outputs of the ½H-bridge circuits 422, 424 may constitute the respective outputs $V_{outp}$ and $V_{outn}$ of the switching amplifier 100.

In accordance with the present disclosure, the outputs $V_{outp}$, $V_{outn}$ of the switching amplifier 100 feed back to the differential integrators 402, 412. In an embodiment, for example, a first feedback path 406 provides feedback from $V_{outp}$ to the inverting input of the first differential integrator 402. In particular, the feedback from $V_{outp}$ is provided to the inverting input of the first differential integrator 402 via a feedback resistor $R_2$. More particularly, in some embodiments, the first feedback path 406 is the only feedback path between the output $V_{outp}$ and the first differential integrator 402.

Likewise, in an embodiment, a second feedback path 416 provides feedback from $V_{outn}$ to the inverting input of the second differential integrator 412. In particular, the feedback from $V_{outn}$ is provided to the inverting input of the second differential integrator 412 via a feedback resistor $R_2$. More particularly, in some embodiments, the second feedback path 416 is the only feedback path between the output $V_{outn}$ and the second differential integrator 412.

An advantageous aspect of the PWM modulator 104 shown in FIG. 4 is the reduction in cross-talk between the plus and minus PWM channels, thus improving linearity.

Figure 5:
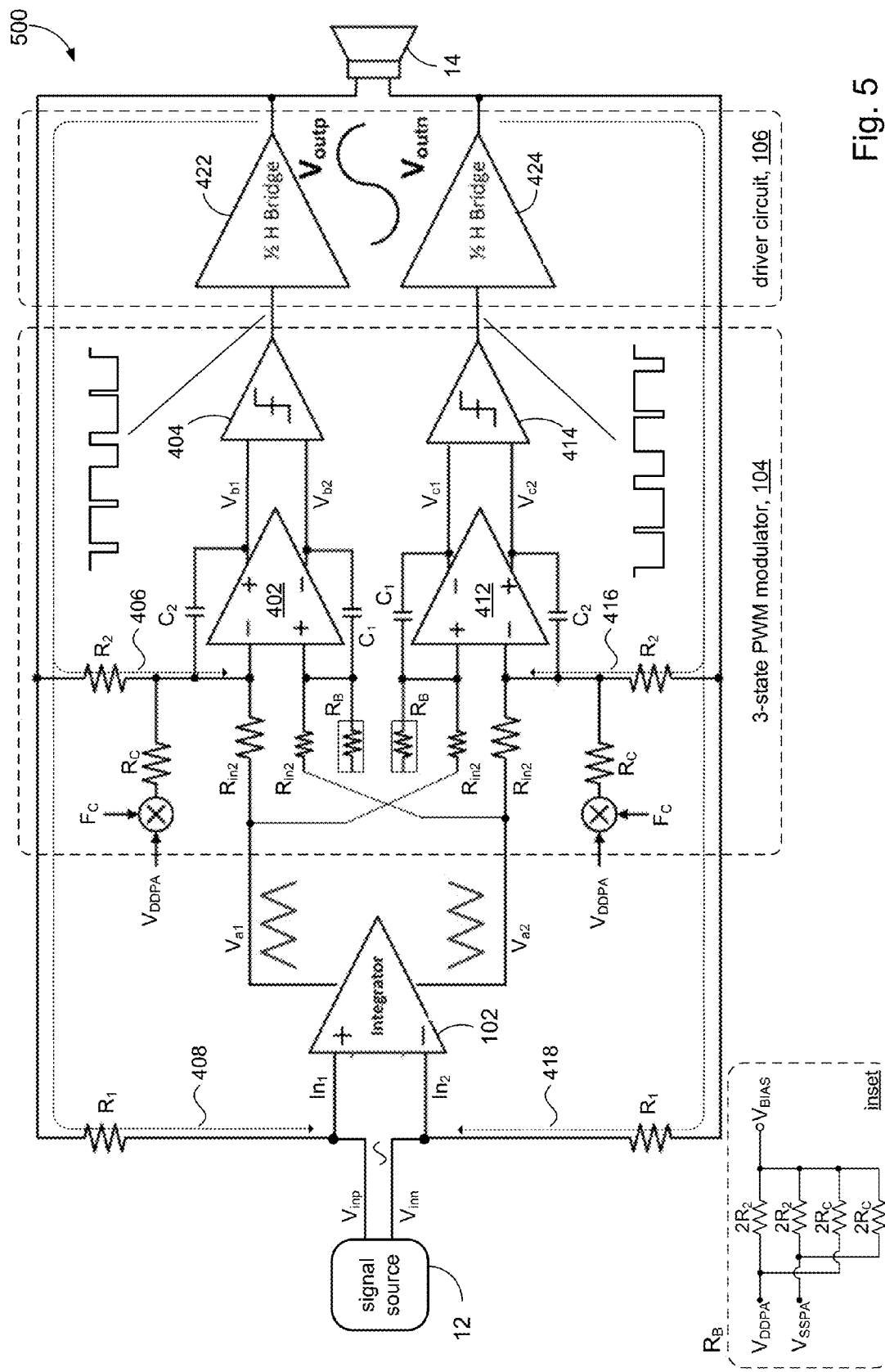
FIG. 5 illustrates another embodiment of a switching amplifier in accordance with the present disclosure.

Referring to FIG. 5, a switching circuit 500 in accordance with another embodiment of the present disclosure is shown. Here, the switching circuit 500 incorporates the detail, shown in FIG. 4, for PWM modulator 104 and driver circuit 106. The switching circuit 500 illustrates an embodiment the does not incorporate the compensation circuit 116 shown in FIG. 1. The switching circuit 500 includes a feedback path 408 from $V_{outp}$ to the non-inverting input of the input integrator 102 via resistor $R_1$. The switching circuit 500 further includes a feedback path 418 from $V_{outn}$ to the inverting input of the input integrator 102 via resistor $R_1$.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. An amplifier circuit comprising:
    an input integrator circuit having an input part and an output part;
    a pulse width modulation (PWM) modulator;
    a driver circuit connected to the PWM modulator, the driver circuit having first and second outputs for connecting to a load; and
    a compensation circuit having an input and an output,
    the input part of the input integrator circuit connected to the output of the compensation circuit and selectively connectable to a signal source,
    the output part of the input integrator circuit selectively connectable to either the PWM modulator or the input of the compensation circuit.

2. The amplifier circuit of claim 1 having a first configuration wherein the input integrator is disconnected from both the signal source and the PWM modulator and connected to the compensation circuit to determine a compensation voltage, and a second configuration wherein the input integrator circuit is connected to the signal source and the PWM modulator, and the input integrator circuit receives the compensation voltage from the compensation circuit.

3. The amplifier circuit of claim 1 having a first configuration wherein the input integrator circuit is operative with the compensation circuit to determine a compensation voltage in response to a voltage at the input part of the input integrator circuit.

4. The amplifier circuit of claim 3 having a second configuration wherein the input integrator circuit is connected to a signal source to provide an input signal to the PWM modulator, wherein the compensation circuit is operative to provide the compensation voltage at the input part of the input integrator circuit.

5. The amplifier circuit of claim 1 wherein the compensation circuit comprises a comparator that is selectively connectable to the output part of the input integrator circuit, a digital to analog converter (DAC) connected the input part of the input integrator circuit, and a memory, wherein the compensation circuit, in a first configuration, is operative with the input integrator circuit as an analog to digital converter (ADC), wherein the memory is operative to store an output of the ADC.

6. The amplifier circuit of claim 5 wherein the compensation circuit is operative, in a second configuration, to provide the memory contents of the memory to the DAC, wherein an output of the DAC compensates an offset voltage of the input integrator circuit.

7. The amplifier circuit of claim 1 wherein the input integrator circuit is operative as a single-ended integrator in a first configuration and as a differential integrator in a second configuration.

8. The amplifier circuit of claim 1 wherein the PWM modulator comprises:
    a first differential integrator having a first input and a second input that is connected to a reference voltage;
    a second differential integrator having a first input and a second input that is connected to a reference voltage;
    first and second comparators having inputs connected to the first and second differential integrators respectively, the first and second comparators having outputs connected to the driver circuit;
    a first feedback path connected between the first output of the driver circuit and the first input of the first differential integrator; and
    a second feedback path connected between the second output of the driver circuit and the first input of the second differential integrator.

9. The amplifier circuit of claim 8 wherein the first feedback path is the only feedback path between the driver circuit and the first differential integrator, wherein the second feedback path is the only feedback path between the driver circuit and the second differential integrator.

10. The amplifier circuit of claim 8 wherein the first inputs of the first and second differential integrators are selectively connectable to the input integrator circuit.

11. An amplifier circuit comprising:
    an integrator circuit having an input part selectively connectable to a signal source and having an output part;
    a pulse width modulation (PWM) modulator selectively connectable to the output part of the integrator circuit;
    a driver circuit connected to the PWM modulator, the driver circuit having first and second outputs for connecting to a load; and
    a compensation circuit having an input selectively connectable to the output part of the integrator circuit and having an output connected to the input part of the integrator circuit,
    the integrator circuit and the compensation circuit operable in a first configuration to determine a DC offset voltage of the integrator circuit,
    the integrator circuit and the compensation circuit operable in a second configuration to provide a compensation voltage to the input part of the integrator circuit, thereby compensating for the DC offset voltage.

12. The amplifier circuit of claim 11 wherein in the first configuration the integrator circuit and the compensation circuit are operable as a successive approximation register (SAR) analog to digital converter (ADC).

13. The amplifier circuit of claim 11 wherein the compensation circuit comprises a digital to analog converter (DAC) and control logic to operate the compensation circuit in conjunction with the integrator circuit in the first configuration as a SAR DAC, wherein the DAC is operable to provide the compensation voltage in the second configuration.

14. An amplifier circuit comprising:
- an input integrator having first and second inputs for a connection to a source signal, the input integrator having first and second outputs;
- a first differential integrator having a first input connected to the first output of the input integrator and a second input connected to a reference voltage, the first differential integrator having first and second outputs;
- a second differential integrator having a first input connected to the second output of the input integrator and a second input connected to a reference voltage, the second differential integrator having first and second outputs;
- a first comparator connected to the first and second outputs of the first differential integrator;
- a second comparator connected to the first and second outputs of the second differential integrator;
- first and second driver circuits connected to the first and second comparators respectively, the first and second driver circuits having respective outputs for a connection to a load;
- a first feedback path connected between the output of the first driver circuit and the first input of the first differential integrator; and
- a second feedback path connected between the output of the second driver circuit and the first input of the second differential integrator.

15. The amplifier circuit of claim 14 wherein the first feedback path is the only feedback path between the first driver circuit and the first differential integrator.

16. The amplifier circuit of claim 15 wherein the second feedback path is the only feedback path between the second driver circuit and the second differential integrator.

17. The amplifier circuit of claim 14 wherein the first feedback path comprises a first resistor directly connected between the output of the first driver circuit and the first input of the first differential integrator.

18. The amplifier circuit of claim 17 wherein the second feedback path comprises a second resistor directly connected between the output of the second driver circuit and the first input of the second differential integrator.

19. The amplifier circuit of claim 14 further comprising a third feedback path connected between the output of the first driver circuit and the first input of the input integrator and a fourth feedback path connected between the output of the second driver circuit and the second input of the input integrator.

20. The amplifier circuit of claim 14 wherein the first and second driver circuits are one-half H-bridge driver circuits.

21. The amplifier circuit of claim 14 further comprising a first resistor network connected to the second input of the first differential integrator and a second resistor network connected to the second input of the second differential integrator, the first and second resistor networks connected to a plurality of voltage levels.

* * * * *